US006737628B2

(12) United States Patent
Fischer et al.

(10) Patent No.: US 6,737,628 B2
(45) Date of Patent: May 18, 2004

(54) METHOD FOR ADJUSTING ILLUMINATION PARAMETERS OF A LASER IMAGESETTER

(75) Inventors: Jörg-Achim Fischer, Laboe (DE); Jörg Suhr, Rickert (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 0 days.

(21) Appl. No.: 10/288,214

(22) Filed: Nov. 5, 2002

(65) Prior Publication Data

US 2003/0052251 A1 Mar. 20, 2003

Related U.S. Application Data

(63) Continuation of application No. PCT/DE01/01754, filed on May 9, 2001.

(30) Foreign Application Priority Data

May 13, 2000 (DE) .......................................... 100 23 662

(51) Int. Cl.$^7$ ................................................ H01L 27/00
(52) U.S. Cl. ..................................... 250/208.1; 250/205
(58) Field of Search ............................. 250/208.1, 205, 250/214 P, 214 D, 201.2, 201.5; 355/67, 68, 69, 55

(56) References Cited

U.S. PATENT DOCUMENTS

| | | |
|---|---|---|
| 3,738,242 A | 6/1973 | Lee et al. |
| 4,563,694 A | 1/1986 | Ohkubo et al. |
| 4,782,365 A | 11/1988 | Takagi |
| 4,907,021 A | 3/1990 | Yabu |
| 5,182,576 A | 1/1993 | Miwa |
| 5,212,569 A | 5/1993 | Takada |
| 5,227,840 A | 7/1993 | Mirzaoff et al. |
| 5,663,554 A | 9/1997 | Henry |
| 5,748,225 A | 5/1998 | Ziph-Schatzberg |
| 5,771,090 A * | 6/1998 | Verlinden et al. ............. 355/27 |

FOREIGN PATENT DOCUMENTS

| | | |
|---|---|---|
| DE | 197 46 331 A1 | 4/1999 |
| DE | 198 25 828 A1 | 12/1999 |
| EP | 0 599 261 A1 | 6/1994 |
| EP | 0 735 739 A2 | 10/1996 |
| JP | 59216165 A | 12/1984 |
| JP | 63286810 A | 11/1988 |
| JP | 08305213 | 11/1996 |
| JP | 11058817 A | 3/1999 |
| JP | 2000029224 A | 1/2000 |

* cited by examiner

*Primary Examiner*—Que T. Le
(74) *Attorney, Agent, or Firm*—Laurence A. Greenberg; Werner H. Stemer; Gregory L. Mayback

(57) ABSTRACT

A method for adjusting variable illumination parameters of a laser imagesetter including laser power, focus adjustment, scan rate, and/or feed rate during the illumination of a photosensitive material, in particular, during illumination tests, includes the steps of reducing the time taken and the workload for determining the correct imagesetter setting by calculating at least some of the illumination parameters, prior to the adjustment, based upon imagesetter-independent characteristic data including material thickness, material sensitivity, material-specific test patterns, and/or material-specific evaluation criteria of the photosensitive material to be illuminated, and, subsequently, adjusting the calculated illumination parameters automatically.

24 Claims, 2 Drawing Sheets

METHOD FOR ADJUSTING ILLUMINATION PARAMETERS OF A LASER IMAGESETTER

CROSS-REFERENCE TO RELATED APPLICATION

This application is a continuation of copending International Application No. PCT/DE01/01754, filed May 9, 2001, which designated the United States and was not published in English.

BACKGROUND OF THE INVENTION

Field of the Invention

The invention relates to the field of laser imagesetters and, in particular, to their tuning for the purpose of optimizing the image quality of a photosensitive material that is illuminated in a laser imagesetter and is subsequently developed, in particular, during illumination tests, in the event of a change between different photosensitive materials or in the event of a variation in their properties.

The tuning of commercially available laser imagesetters to the photosensitive material to be illuminated, for example, films, pieces of paper, or printing plates, which usually needs to be carried out in the event of a change of the material or in the event of a change to its properties by the manufacturer, usually takes place with the aid of test illuminations. During these test illuminations, a particular test pattern is selected as a function of the material being used, and the photosensitive material is illuminated in the laser imagesetter with the test pattern, to evaluate it after developing, the criteria of the evaluation being different according to the material being used. For each of several possible imagesetter resolutions, a separate test run is carried out, during which the material being used is successively subjected to a filter test and a light test, to check by evaluating the developed test patterns whether or not optimum results can be obtained with the selected imagesetter adjustment. In addition, a focus test is carried out for each material to check the focus adjustment of the imagesetter with respect to the material being used.

Carrying out these test illuminations, however, takes a comparatively long time and entails a comparatively high workload. For instance, the time taken in the case of five possible imagesetter resolutions and an average duration of 10 minutes per test is almost 2 hours to carry out the 11 necessary tests (5 filter tests, 5 light tests, and 1 focus test). When two different materials are being used, for example, film and offset sheet, as many as 22 tests are necessary, and the time taken is, therefore, twice as long.

If the result of the test illuminations does not correspond to expectations, the test illuminations need to be carried out again after varying some of the imagesetter adjustments.

Variations in the imagesetter—material—developing machine process chain, for example, batch-dependent variations of the photosensitive material or variations due to ageing of developer chemicals, can also make it necessary to repeat the test illuminations.

The test illuminations are usually carried out according to the specifications, for the photosensitive material respectively being used, from the manufacturer who, prior to a market release, determines the imagesetter adjustments that are most suitable as a standard and supplies these to the customer while citing the respective manufacturer reference. The manufacturer references used by different manufacturers, however, are of different types and do not contain any information about material-specific properties, such as material thickness and material sensitivity, which would permit the customer to derive illumination parameters tailored to his or her own requirement from them.

SUMMARY OF THE INVENTION

It is accordingly an object of the invention to provide a method for adjusting illumination parameters of a laser imagesetter that overcomes the hereinafore-mentioned disadvantages of the heretofore-known devices and methods of this general type and that reduces the time taken and the workload for determining the correct imagesetter adjustment.

With the foregoing and other objects in view, there is provided, in accordance with the invention, a method for adjusting variable illumination parameters of a laser imagesetter, including the steps of defining variable illumination parameters of the laser imagesetter including at least one of the group consisting of laser power, focus adjustment, scan rate, and feed rate, adjusting the illumination parameters of the laser imagesetter during illumination tests of a photosensitive material by calculating at least some of the illumination parameters prior to the adjustment based upon imagesetter-independent characteristic data selected from at least one of the group consisting of material thickness, material sensitivity, material-specific test patterns, and material-specific evaluation criteria of the photosensitive material to be illuminated, and subsequently automatically adjusting the calculated illumination parameters.

According to a first aspect of the invention, at least some of the illumination parameters are calculated, prior to the adjustment, based upon imagesetter-independent characteristic data including material thickness, material sensitivity, material-specific test patterns, and/or material-specific evaluation criteria of the photosensitive material to be illuminated.

This aspect of the invention is based on the idea of replacing the instructions for carrying out the test illuminations by imagesetter-independent material-specific characteristic data, which are used as a basis for calculating suitable illumination parameters as well as for automating an illumination process and, in particular, test illuminations by corresponding automatic control of the laser imagesetter based upon the calculated illumination parameters.

The term imagesetter-independent characteristic data refers to material-specific data such as material thickness, material sensitivity, material-specific test patterns, and/or material-specific evaluation criteria, which can be given without reference to a particular laser imagesetter, although these characteristic data may also include data such as an imagesetter resolution, if this material-specific imagesetter resolution is suitable for arbitrary laser imagesetters.

From the imagesetter-independent characteristic data, the imagesetter-specific illumination parameters are, then, calculated in a particular laser imagesetter, or in a computer connected to it; besides the imagesetter-independent characteristic data, imagesetter-specific characteristic data, for example, laser-diode current, laser-diode power, filters, or shutters, also have an influence in the calculation.

The imagesetter-independent characteristic data are advantageously stored on a data medium, for example, a CD-ROM or a floppy disk, which can be read by the laser imagesetter or by a computer connected to the laser imagesetter, or they may be called up by the customer directly through data lines, for example, over the Internet from a homepage of the manufacturer of the imagesetter or of the photosensitive material. Taken together, the imagesetter-independent characteristic data of a material to be illuminated will be referred to below as material drivers, by analogy with corresponding terms in the computer sector.

To permit fast processing of the characteristic data, in accordance with another mode of the invention, prior to the illumination of a photosensitive material, suitable illumination parameters such as laser power, focus adjustment, scan rate, and/or feed rate be calculated by a processor integrated in the laser imagesetter, or a processor of a computer connected to the laser imagesetter, from its material drivers by using predetermined algorithms; the algorithm for calculating the laser power contains, as a variable, at least the material sensitivity, expressed as an energy density, and advantageously furthermore an imagesetter resolution that is suitable for the material and a scan rate that is dependent on the imagesetter resolution, while the algorithm for calculating the focus adjustment contains at least the material thickness as a variable.

In accordance with a further mode of the invention, advantageously, the calculation of the focus adjustment begins from a reference focal point, which has been determined beforehand at a defined temperature for a reference material with a defined material thickness; the algorithm for calculating the focus adjustment contains, as a variable, the difference between the material thickness of the photosensitive material to be illuminated and the defined material thickness, as well as a difference, if there is one, between the defined temperature and a temperature prevailing during the illumination.

To permit fast access to the material drivers in the event of a change between different photosensitive materials, in accordance with an added mode of the invention, it is proposed that a plurality of material drivers be stored as a database in an internal memory of the laser imagesetter, or in a memory of a computer connected to it, from where a required material driver will be called up by a utility or management program, which will be referred to below as a material manager by analogy with a corresponding term in the computer sector. To simplify the calling up of the material drivers, each of the plurality of photosensitive materials in the database is advantageously provided with an address, which can be accessed by inputting a manufacturer code and a material code so that confusion between similar material codes of different manufacturers can be avoided. The manufacturer and material codes may, for example, be input on a control panel of the imagesetter, by a keyboard or a mouse pointer on a screen interface of the computer, or by a barcode reader, which is used to read barcodes applied to the photosensitive material itself to avoid confusion.

In accordance with an additional mode of the invention, there is provided the step of selecting from databases characteristic data of the respective photosensitive material to be illuminated with the imagesetter-independent characteristic data of a plurality of photosensitive materials.

In accordance with yet another mode of the invention, there is provided the step of providing each of the plurality of photosensitive materials in the database with an identifier.

In accordance with yet a further mode of the invention, there are provided the steps of storing the database with the imagesetter-independent characteristic data in a memory of one of the imagesetter and of a computer connected to the imagesetter and reading out the associated characteristic data and transferring the associated characteristic data to the processor to calculate the illumination parameters when one of the identifiers is input.

With the objects of the invention in view, there is also provided a method for adjusting variable illumination parameters of a laser imagesetter, including the steps of defining variable illumination parameters of the laser imagesetter including at least one of the group consisting of laser power, focus adjustment, scan rate, and feed rate, adjusting the illumination parameters of the laser imagesetter during illumination tests of a photosensitive material by calculating at least some of the illumination parameters prior to the adjustment based upon imagesetter-independent characteristic data selected from at least one of the group consisting of material thickness, material sensitivity, material-specific test patterns, and material-specific evaluation criteria of the photosensitive material to be illuminated, subsequently automatically adjusting the calculated illumination parameters, successively illuminating the photosensitive material in the course of a single illumination test with a plurality of laser-power levels of the imagesetter to determine the laser power, an increment of the laser power between two adjacent laser-power levels being constant on a logarithmic power scale, and developing and evaluating the illuminated material following the illumination test to determine a most suitable laser-power level.

For photosensitive materials with unknown characteristic data, the illumination parameters to be adjusted may be determined by illumination tests, the number of which can be reduced if, in accordance with yet an added mode of the invention, the necessary laser power is determined by successively illuminating the photosensitive material in the course of a single illumination test with a plurality of laser-power levels of the imagesetter, the increment of the laser power between two adjacent laser-power levels being constant on a logarithmic power scale, and by developing and evaluating the illuminated material following the illumination test.

Furthermore, in the case of a plurality of possible imagesetter resolutions, the number of test illuminations can be reduced to one if, in accordance with yet an additional mode of the invention, the laser imagesetter is analyzed over the entire range of its possible adjustments during the initialization phase, the laser power for a first imagesetter resolution is selected according to the manufacturer's information or from experience, and the laser powers for the further imagesetter resolutions are mathematically calculated and adjusted by using this as a basis, while taking the results obtained during the analysis into account.

With the objects of the invention in view, there is also provided a method for adjusting variable illumination parameters of a laser imagesetter, including the steps of defining variable illumination parameters of the laser imagesetter including at least one of the group consisting of laser power, focus adjustment, scan rate, and feed rate, adjusting the illumination parameters of the laser imagesetter during illumination tests of a photosensitive material by calculating at least some of the illumination parameters prior to the adjustment based upon imagesetter-independent characteristic data selected from at least one of the group consisting of material thickness, material sensitivity, material-specific test patterns, and material-specific evaluation criteria of the photosensitive material to be illuminated, subsequently automatically adjusting the calculated illumination parameters, illuminating the photosensitive material with a material-specific test pattern simultaneously developed during subsequent developing of the material in a developer, subsequently evaluating the simultaneously developed test pattern, and automatically varying some of illumination parameters and process parameters of the developer as a function of a result of the evaluation.

Because the process of illuminating the photosensitive material may be subject to variations, for example, due to a decrease in the laser power of the laser imagesetter, in accordance with again another mode of the invention, it is proposes that the illuminated photosensitive material be developed to make a test pattern, that the test pattern subsequently be evaluated, and, as a function of the results of the evaluation, that some or all of the illumination parameters be varied automatically if appropriate. Advantageously, the evaluation takes place by a measuring instrument, for example, by a densitometer, which measures the difference between an actual value of the optical density of the test pattern that is generated and a predetermined setpoint value. A correction value is subsequently calculated from the measured difference, and it is, likewise, included as a variable in one or more of the algorithms used for calculating the illumination parameters.

Expediently, one of the illumination parameters is selected as a guide value, for example, the value of the energy density in the developer, and its calculation includes, as a variable, the correction value determined during the evaluation of the test pattern, while the other illumination parameters are varied according to a predetermined relationship in the event of a variation of the guide value.

Because variations may also be induced by effects within the developing process, for example, due to ageing of developer chemicals in a developing machine connected downstream of the imagesetter, and because it may not necessarily be possible to compensate for these effects by correcting the illumination parameters in the imagesetter. In accordance with again a further mode of the invention, it is proposed that the correction value determined during the evaluation of the test pattern be employed alternatively or additionally to regulate the developing process in the developing machine.

Other features that are considered as characteristic for the invention are set forth in the appended claims.

Although the invention is illustrated and described herein as embodied in a method for adjusting illumination parameters of a laser imagesetter, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
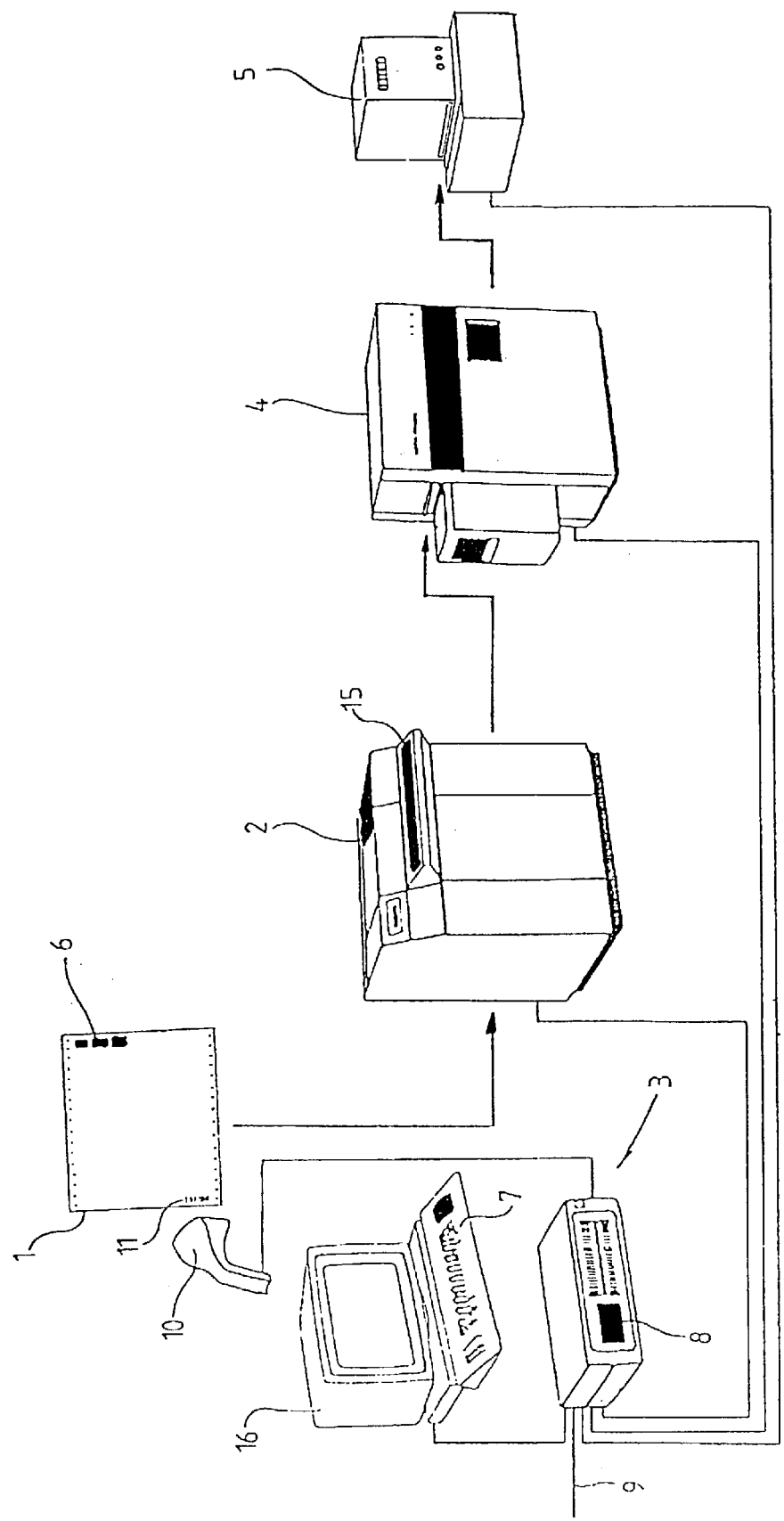
FIG. 1 is a diagrammatic perspective illustration of an overview of equipment illustrating the method according to the invention.

Referring now to the figures of the drawings in detail and first, particularly to FIG. 1 thereof, there is shown equipment for illuminating and developing photosensitive material (1), for example, offset sheet or film, the equipment including a laser imagesetter (2), for example, an internal-drum imagesetter sold by Heidelberger Druckmaschinen AG (applicant company) under the name Herkules, a PC or personal computer (3) connected to it, or a workstation for controlling the laser imagesetter (2), and a film-developing machine (4) in which the material (1) illuminated in the laser imagesetter (2) is developed, as well as a measuring instrument (5) for evaluating a simultaneously illuminated and simultaneously developed test pattern (6) on one edge of the photosensitive material (1).

The PC (3) includes a keyboard (7), a non-illustrated mouse, a CD-ROM drive (8) and a connection to a data line (9) for transferring information from external databases, for example, over the Internet, and it is optionally connected at a further interface to a barcode reader (10) for reading barcodes (11) on the photosensitive material (1).

In the present exemplary embodiment, the measuring instrument (5) is a densitometer for measuring the optical density and/or a raster tone value of the respective test pattern (6), as well as for carrying out comparative density measurements, and it is, advantageously, a SIMPLE densitometer, which is used to measure the difference between a setpoint value and the actual value of the optical density of the respective test pattern (6).

The laser imagesetter (2), the PC (3), the developing machine (4), and the densitometer (5) otherwise correspond in terms of configuration to customary devices of the relevant type, which are known to the person skilled in the art and are conventional, and that need not, therefore, be described in detail here. Instead of a PC (3) connected to the laser imagesetter (2), it is also possible to use hardware components integrated in the laser imagesetter (2), which are additionally built into it or are already present and are simultaneously used, for example, an RIP processor of the imagesetter (2) instead of a processor (12) (see FIG. 2) of the PC (3).

Figure 2:
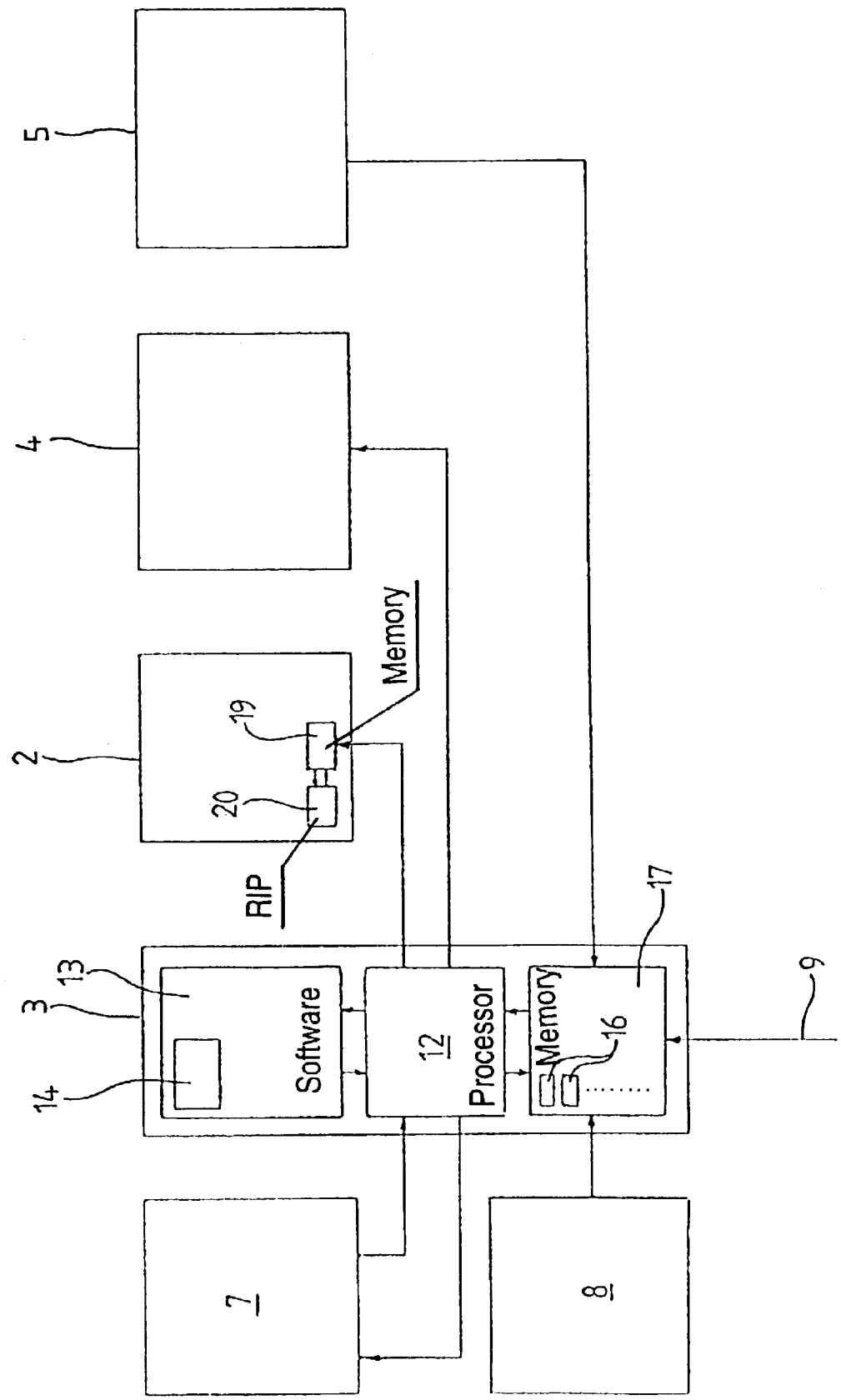
FIG. 2 is a block circuit diagram illustrating interaction of the individual devices of FIG. 1 during the illumination and developing of a photosensitive material according to the invention.

As represented most clearly in FIG. 2, the software (13) of the PC (3) includes a utility or management program, referred to below as a material manager (14), which can be called up by the keyboard (7) or the mouse pointer or a control box (15) on the laser imagesetter (2). The material manager (14) is used for managing a range of internal databases, referred to below as material drivers (16), in a memory (17) of the PC (3), which respectively include a range of imagesetter-neutral or imagesetter-independent characteristic data for each photosensitive material (1) to be illuminated on the imagesetter (2).

These material drivers (16) that, for example, are provided by the manufacturer of the imagesetter (2) or of the photosensitive material (1), include as imagesetter-neutral characteristic data, inter alia, the thickness of the photosensitive material (1) in $\mu$m, the length of the photosensitive material (1) in m, the material polarity (positive/negative), the material sensitivity as energy density in $mJ/m^2$, a particularly well-suited test pattern (6) for the respective material (1) in PostScript or as a classification reference, as well as a material-specific evaluation criterion as a value or as a classification reference. The material drivers (16) are provided, for example, on a CD-ROM to be sent to the user and to be read using the CD-ROM drive (8) of the PC (3), or on an Internet homepage for downloading the files through the data line (9).

Upon input of an imagesetter resolution desired by the user, a manufacturer code (for example, a name abbreviation of the manufacturer of the material (1) that is now to be illuminated, as well as a material code, for example, a material abbreviation, on the keyboard (7), by clicking with the mouse pointer on a screen interface of a monitor (16) of the PC (3) or by reading a barcode (11) on the material (1) or its packaging by the barcode reader (10), the corresponding material driver (16) is called up by the processor (12) as a database by the material manager (14) from the memory (17) and transferred to the laser imagesetter (2), where the characteristic data are stored in a memory (19) of the imagesetter (2).

The data from the buffer memory are subsequently processed in the RIP (20), or in another processor of the imagesetter (2), and are correlated by corresponding algorithms with characteristic data internal to the imagesetter, or imagesetter-dependent characteristic data, for example, characteristic data for the adjusted laser-diode current in A, filters or shutters that are used, to calculate therefrom the illumination parameters for the subsequent illumination of the photosensitive material (1), in particular, the laser power in W, the laser spot diameter in $\mu$m, the focus position or focus adjustment in um, the feed rate in m/s, and the scan rate in m/s.

The characteristic data of the material drivers (16), and the characteristic data internal to the imagesetter that are, likewise, stored in the memory (19) of the imagesetter (2), are selected such that these data can be used directly by the processor (20) as variables in a corresponding algorithm, from which one of the desired illumination parameters is, then, derived. Advantageously, matching unit systems are used for the material drivers (16) and the characteristic data internal to the imagesetter to avoid conversion. For example, all the data are given in the SI system.

As an example, the algorithm for the laser power P in W or J/s may have the following form:

$$P = (Ev \times v)/A, \quad (1)$$

where:
Ev is the material sensitivity of the photosensitive material as energy density in $10^{-3}$ J/m$^2$;
A is the input resolution converted from pixel/cm into 1/m; and
v is the scan rate in m/s.

The scan rate v is, for example, calculated according to the following algorithm for a drum imagesetter:

$$v = 2\pi \times a \times n, \quad (2)$$

where:
a is the distance from the spinning mirror to the photosensitive material in m; and
n is the spin rate of the spinning mirror in 1/s.

For a material (1) with unknown material sensitivity, the laser power actually required can be determined by a single illumination test, in which the material (1) is successively illuminated with different laser powers in the imagesetter (2), a particular test pattern (6) being specified for each illumination. Between two adjacent or successive illuminations, the laser power is varied such that the amplitude of the variation, that is to say, the difference between two adjacent power levels, remains constant on a logarithmic power scale. This means that the increment of the laser power between two illumination adjustments is small at low laser powers and rises exponentially with increasing laser power.

After illumination, the material (1) is developed in the developer (4), and the test patterns (6) produced during the illumination are evaluated using the densitometer (5) to determine, from among the test patterns (6) produced during the illumination, the one for which the differences between the actual values of the optical density of the test pattern (6) and corresponding stored setpoint values are the smallest. The associated illumination parameters for the test pattern (6) thus determined are subsequently stored in the memory (17), in a similar way as the material drivers (16), so that they can be called up again when required, that is to say, for another illumination of the same material (1) in the imagesetter (2). To calculate the focus adjustment, the imagesetter (2) has a so-called reference focal point, which is determined at the factory, with a reference material of predetermined thickness, for this material. When another material is being used, the difference between the thickness of the reference material and the thickness contained in the material driver (16) pertaining to the material (1) being used is determined by the processor (20), and a corresponding modification of the focus adjustment is made as a function of this difference. In a corresponding way, it is possible to calculate and compensate for shifts of the focus position at higher or lower temperatures, by determining the difference from the reference temperature and by calculating the expansion or contraction of the material due to this temperature difference, before compensating for the calculated expansion or contraction by varying the focal point.

Because a uniform quality of the illuminated and developed photosensitive material (1) presupposes sufficient stability of the process parameters throughout the illumination and developing processes, which is not always guaranteed for various reasons, the material (1) is provided not only during the illumination tests for unknown materials, but also advantageously during each illumination process, with a test pattern that is evaluated after illumination and developing of the material. The test pattern, like the represented test pattern (6), advantageously lies outside the setting mirror in the vicinity of one of the edges of the material (1). The test pattern (6) respectively used is material-dependent and comes from the material driver (16), from where it is read with the aid of the material manager (14), before the photosensitive material (1) is automatically illuminated with the read-out test pattern (6) in the imagesetter (2). The test pattern (6) may assume a plurality of different forms and, for example, it may include three different subregions, of which one has 100% darkening to check the optical density, one has a 50% raster area to check the raster tone value, and, for comparative density measurements, is provided with various raster/line and point patterns, as well as combinations of such patterns. After its illumination, the photosensitive material (1) first passes through the developing machine (4), in which it is developed with the aid of developer chemicals, and, subsequently, the densitometer (5), in which the test patterns (6) are compared, the material (1) being static or moved, with a corresponding reference test pattern, to determine differences possibly existing between the respective actual values of the optical density of the test pattern (6) and predetermined setpoint values of the optical density of the reference test pattern.

The result of the comparison is transferred from the densitometer (5) to the PC (3), and is stored in the memory (17), from where it is read out at regular time intervals and evaluated by the processor (12). During the evaluation, the type, position, and size of the difference between the actual value and the setpoint value, as well as, optionally, a time variation of this difference, are compared with corresponding stored difference values, the cause of which is known or which have been induced at the factory by deliberate variation of illumination parameters during calibration of the imagesetter (2). From the type, the position, and the size of the differences, as well as, optionally, their time variation, conclusions can be drawn subsequently about the causes of the differences, and these can be eliminated by corresponding countermeasures. Alternatively, each material driver (16) may contain a previously determined gradation or darkening curve for the associated material (1), which is sent by the material manager (14) to the processor (12) and is compared there with a gradation or darkening curve determined during evaluation of the test pattern (6). As such, it is possible to determine likewise existing differences or deviations, which can, then, be eliminated by corresponding countermeasures.

The countermeasures for eliminating the differences or deviations expediently lie in varying a corresponding guide value of the imagesetter (2), for example, its energy density, so as to counteract the differences that are encountered. This means that if the optical density of the test pattern is much less than the optical density of the reference test pattern in the case of a material with positive material polarity, which is darkened during the illumination, the laser power is increased to enhance the darkening. Besides the guide value, further parameters may, optionally, be varied if so required; this variation may take place proportionally to the variation of the guide value or independently thereof.

Because the quality of the illuminated and developed material (1) is influenced not only by the illumination parameters but also by the process parameters of the developing machine (4), for example, by aging of developer chemicals that entails a loss of quality, it is expedient when finding certain deviations or variations of the test patterns (6) that are caused by the developing, not to vary the illumination parameters but to provide for a corresponding variation of the process parameters of the developing machine (4). In the simplest case, this may, for example, be replacement of the developer chemicals in the developing machine (4), which is advantageously, likewise, done under processor control as a function of the result of the test-pattern evaluation.

We claim:

1. A method for adjusting variable illumination parameters of a laser imagesetter, which comprises:
   defining variable illumination parameters of the laser imagesetter including at least one of the group consisting of laser power, focus adjustment, scan rate, and feed rate;
   adjusting the illumination parameters of the laser imagesetter during illumination tests of a photosensitive material by calculating at least some of the illumination parameters prior to the adjustment based upon imagesetter-independent characteristic data selected from at least one of the group consisting of material thickness, material sensitivity, material-specific test patterns, and material-specific evaluation criteria of the photosensitive material to be illuminated; and
   subsequently automatically adjusting the calculated illumination parameters.

2. The method according to claim 1, which comprises calculating the illumination parameters, based upon predetermined algorithms, by a processor one of integrated in the laser imagesetter and connected to the laser imagesetter.

3. The method according to claim 2, wherein an algorithm for calculating at least one of the scan rate and the feed rate includes, as a variable, a material-specific imagesetter resolution to be input.

4. The method according to claim 2, wherein an algorithm for calculating the laser power includes, as a variable, a material sensitivity expressed in the form of an energy density.

5. The method according to claim 4, wherein the algorithm for calculating the laser power also includes, as a variable, a scan rate and one of a specific imagesetter resolution and an input imagesetter resolution.

6. The method according to claim 2, wherein an algorithm for calculating the focus adjustment includes, as a variable, at least the material thickness.

7. The method according to claim 6, which further comprises:
   beginning the calculation of the focus adjustment from a reference focal point determined beforehand for a reference material with a defined material thickness; and
   the algorithm for calculating the focus adjustment includes, as a variable, a difference between the defined material thickness and the material thickness of the photosensitive material to be illuminated.

8. The method according to claim 7, which further comprises:
   determining the reference focal point at a defined temperature; and
   the algorithm for calculating the focus adjustment includes, as a variable, a difference between the defined temperature and a temperature prevailing during the illumination.

9. The method according to claim 3, wherein an algorithm for calculating the laser power includes, as a variable, a material sensitivity expressed in the form of an energy density.

10. The method according to claim 9, wherein the algorithm for calculating the laser power also includes, as a variable, a scan rate and one of a specific imagesetter resolution and an input imagesetter resolution.

11. The method according to claim 3, wherein an algorithm for calculating the focus adjustment includes, as a variable, at least the material thickness.

12. The method according to claim 11, which further comprises:
    beginning the calculation of the focus adjustment from a reference focal point determined beforehand for a reference material with a defined material thickness; and
    the algorithm for calculating the focus adjustment includes, as a variable, a difference between the defined material thickness and the material thickness of the photosensitive material to be illuminated.

13. The method according to claim 12, which further comprises:
    determining the reference focal point at a defined temperature; and
    the algorithm for calculating the focus adjustment includes, as a variable, a difference between the defined temperature and a temperature prevailing during the illumination.

14. The method according to claim 1, which further comprises selecting from databases characteristic data of the respective photosensitive material to be illuminated with the imagesetter-independent characteristic data of a plurality of photosensitive materials.

15. The method according to claim 14, which further comprises providing each of the plurality of photosensitive materials in the database with an identifier.

16. The method according to claim 15, wherein the identifier is a manufacturer code and a material code.

17. The method according to claim 14, which further comprises:
    storing the database with the imagesetter-independent characteristic data in a memory of one of the imagesetter and of a computer connected to the imagesetter; and reading out the associated characteristic data and transferring the associated characteristic data to the processor to calculate the illumination parameters when one of the identifiers is input.

18. A method for adjusting variable illumination parameters of a laser imagesetter, which comprises:

defining variable illumination parameters of the laser imagesetter including at least one of the group consisting of laser power, focus adjustment, scan rate, and feed rate;

adjusting the illumination parameters of the laser imagesetter during illumination tests of a photosensitive material by calculating at least some of the illumination parameters prior to the adjustment based upon imagesetter-independent characteristic data selected from at least one of the group consisting of material thickness, material sensitivity, material-specific test patterns, and material-specific evaluation criteria of the photosensitive material to be illuminated;

subsequently automatically adjusting the calculated illumination parameters;

illuminating the photosensitive material with a material-specific test pattern simultaneously developed during subsequent developing of the material in a developer;

subsequently evaluating the simultaneously developed test pattern; and automatically varying some of illumination parameters and process parameters of the developer as a function of a result of the evaluation.

19. The method according to claim 18, which further comprises:

selecting one of the illumination parameters as a guide value; and simultaneously varying other illumination parameters in the event of a variation of the guide value.

20. The method according to claim 18, which further comprises evaluating the test pattern in a densitometer.

21. The method according to claim 18, which further comprises determining the illumination parameters to be adjusted for a photosensitive material with unknown characteristic data by illumination tests.

22. The method according to claim 21, which further comprises:

analyzing the laser imagesetter over an entire range of possible adjustments during an initialization;

selecting a laser power for a first imagesetter resolution one of according to manufacturer's information and from experience; and mathematically calculating and adjusting laser powers for further imagesetter resolutions utilizing the selected laser power as a basis while taking results obtained during the analysis into account.

23. A method for adjusting variable illumination parameters of a laser imagesetter, which comprises:

defining variable illumination parameters of the laser imagesetter including at least one of the group consisting of laser power, focus adjustment, scan rate, and feed rate;

adjusting the illumination parameters of the laser imagesetter during illumination tests of a photosensitive material by calculating at least some of the illumination parameters prior to the adjustment based upon imagesetter-independent characteristic data selected from at least one of the group consisting of material thickness, material sensitivity, material-specific test patterns, and material-specific evaluation criteria of the photosensitive material to be illuminated;

subsequently automatically adjusting the calculated illumination parameters;

successively illuminating the photosensitive material in the course of a single illumination test with a plurality of laser-power levels of the imagesetter to determine the laser power, an increment of the laser power between two adjacent laser-power levels being constant on a logarithmic power scale; and developing and evaluating the illuminated material following the illumination test to determine a most suitable laser-power level.

24. The method according to claim 23, which further comprises:

illuminating the photosensitive material with a material-specific test pattern simultaneously developed during subsequent developing of the material in a developer;

subsequently evaluating the simultaneously developed test pattern; and automatically varying some of illumination parameters and process parameters of the developer as a function of a result of the evaluation.

* * * * *